US010431119B2

(12) United States Patent
Shah

(10) Patent No.: US 10,431,119 B2
(45) Date of Patent: Oct. 1, 2019

(54) BRAILLE CELLS AND ASSEMBLIES FOR SINGLE-LINE BRAILLE DISPLAYS

(71) Applicant: Inceptor Technologies Pvt. Ltd., Ahmedabad (IN)

(72) Inventor: Shyam Shah, Ahmedabad (IN)

(73) Assignee: Inceptor Technologies Pvt. Ltd., Ahmedabad (IN)

( * ) Notice: Subject to any disclaimer, the term of this patent is extended or adjusted under 35 U.S.C. 154(b) by 224 days.

(21) Appl. No.: 15/674,658

(22) Filed: Aug. 11, 2017

(65) Prior Publication Data

US 2018/0033336 A1 Feb. 1, 2018

Related U.S. Application Data

(63) Continuation of application No. PCT/IN2016/050237, filed on Jul. 12, 2016.

(30) Foreign Application Priority Data

May 25, 2016 (IN) .............................. 201621018020

(51) Int. Cl.
G09B 21/00 (2006.01)
G09B 21/02 (2006.01)
(Continued)

(52) U.S. Cl.
CPC ......... G09B 21/004 (2013.01); G09B 21/007 (2013.01); G09B 21/02 (2013.01);
(Continued)

(58) Field of Classification Search
USPC .................. 434/112–115, 117; 400/109.1
See application file for complete search history.

(56) References Cited

U.S. PATENT DOCUMENTS 5,086,287 A * 2/1992 Nutzel ................. G09B 21/003
340/407.1
5,226,817 A * 7/1993 Nakajima ............ G09B 21/004
434/112

(Continued)

FOREIGN PATENT DOCUMENTS

WO 2016IN00037 8/2016

OTHER PUBLICATIONS

WIPO, Written Opinion in corresponding PCT Application PCT/IN2016/050237, dated Mar. 20, 2017.

(Continued)

Primary Examiner — Kurt Fernstrom
(74) Attorney, Agent, or Firm — Ryan Alley IP

(57) ABSTRACT

Braille cells and assemblies include an actuator that engages and makes readable a Braille dot by moving a shaft on a base to engage the dot. An electro-permanent magnet and a separate magnetic plate on the shaft can cause the rotation. By running an electric pulse through the electro-permanent magnet, it will rotate the shaft about a pivot under attraction to the magnetic plate. The shaft then engages tactile with the Braille dot to make it and potentially other dots form a Braille character. An electric pulse in an opposite direction may cause the magnetic field to cease and the tactile pin to disengage. The electro-permanent magnet may be coupled a mesh of rows and columns each with a P-channel MOSFET and N-channel MOSFET on opposite ends. The magnet may be at an intersection of a row and a column with diodes, which may be Zenner diodes.

13 Claims, 6 Drawing Sheets

(51) Int. Cl.
H01L 29/43 (2006.01)
H01L 29/66 (2006.01)
*F16D 3/10* (2006.01)
*G09F 9/37* (2006.01)
*H01F 7/02* (2006.01)

(52) U.S. Cl.
CPC ...... *H01L 29/435* (2013.01); *H01L 29/66106* (2013.01); *F16D 3/10* (2013.01); *G09F 9/375* (2013.01); *H01F 7/0278* (2013.01)

(56) References Cited

U.S. PATENT DOCUMENTS

| | | | | |
|---|---|---|---|---|
| 6,693,516 B1* | 2/2004 | Hayward | ............ | G09B 21/004 340/4.12 |
| 6,705,868 B1* | 3/2004 | Schleppenbach | .... | G09B 21/004 434/112 |
| 6,734,785 B2* | 5/2004 | Petersen | ............. | G09B 21/004 340/4.12 |
| 6,776,619 B1* | 8/2004 | Roberts | ................ | G09B 21/001 340/4.12 |
| 6,881,063 B2* | 4/2005 | Yang | .................... | G09B 21/001 434/114 |
| 7,097,457 B2* | 8/2006 | Kajino | ................. | G09B 21/004 434/112 |
| 7,367,806 B1* | 5/2008 | Murphy | .............. | G09B 21/004 434/112 |
| 7,497,687 B2* | 3/2009 | Shin | ..................... | G09B 21/004 434/113 |
| 7,744,372 B1* | 6/2010 | Minnich | ............... | G09B 21/02 434/113 |
| 8,690,576 B2* | 4/2014 | Murphy | .............. | G09B 21/003 434/114 |
| 9,390,676 B2* | 7/2016 | Nieves | ................... | G06F 3/016 |

OTHER PUBLICATIONS

WIPO, International Search Report in corresponding PCT Application PCT/IN2016/050237, dated Mar. 20, 2017.

\* cited by examiner

BRAILLE CELLS AND ASSEMBLIES FOR SINGLE-LINE BRAILLE DISPLAYS

RELATED APPLICATIONS

This application claims priority under 35 U.S.C. § 120 to, and is a continuation of, co-pending International Application PCT/IN2016/050237, filed Jul. 12, 2016 and designating the US. This International application is incorporated by reference herein in its entirety.

BACKGROUND

Blindness and visual impairment are conditions of poor visual perception. Blindness causes severe impairment in daily or normal life and routine. As of 2012 there were 285 million visually-impaired people in the world, of which 246 million had low vision and 39 million were blind. Literacy rate among blind is as low as 2% in developing countries and 10% in others because of the difficulty of learning Braille and lack of teachers as well as a lack of resources during learning and post learning.

Braille is a tactile writing system used by the blind and the visually impaired. It is traditionally written with embossed paper. Braille-users can read computer screens and other electronic supports thanks to refreshable Braille displays. Commercially available Braille displays use electromechanical Braille cells which utilize piezoelectric reeds to move the dots. Typically, the piezoelectric reeds are stacked in 2 columns and in 4 rows connected to 8 Braille dots. By applying an electric voltage, the reeds bend pushing the Braille dots through the reading surface emulating a Braille dot.

FIG. 1 illustrates an assembly drawing of a related art piezoelectric Braille cell. Reference numeral 2 refers to Braille dots on a cap 3. Reference numeral 4 refers to a pin which is located on a base 6, which pins are activated by inputs from a PCB 7 in relation to a line that is to be displayed. Reference numeral 8 refers to a piezoelectric bimorph which activates the pins 4.

SUMMARY

Example embodiments include braille cells and assemblies including Braille cells for displaying a line of Braille. Example embodiments include an actuator that engages and makes readable a Braille dot by rotating to engage the dot. The actuation may be achieved by a shaft that can flex or pivot about a horizontal base. An electro-permanent magnet and a magnetic plate on the shaft can cause the rotation. For example, when the electro-permanent magnet has its magnetic field or flux activated, it will rotate the shaft about the base to draw closer to the magnetic plate. A tactile pin at the end of the rod then engages with a Braille dot, making it readable. The activation may be started by an electric pulse in one direction and stopped by an electric pulse in an opposite direction, causing the tactile pin to disengage. The electro-permanent magnet may be coupled a mesh framework with rows of a P-channel MOSFET on one end and an N-channel MOSFET on another end and columns of a P-channel MOSFET on one end and an N-channel MOSFET on another end. The magnet may be at an intersection of row and column with diodes on each side, to permit unidirectional current flow responsive to a switch. The diodes may be zener diodes.

BRIEF DESCRIPTIONS OF THE DRAWINGS

Example embodiments will become more apparent by describing, in detail, the attached drawings, wherein like elements are represented by like reference numerals, which are given by way of illustration only and thus do not limit the example embodiments herein.

DETAILED DESCRIPTION

Figure 1:
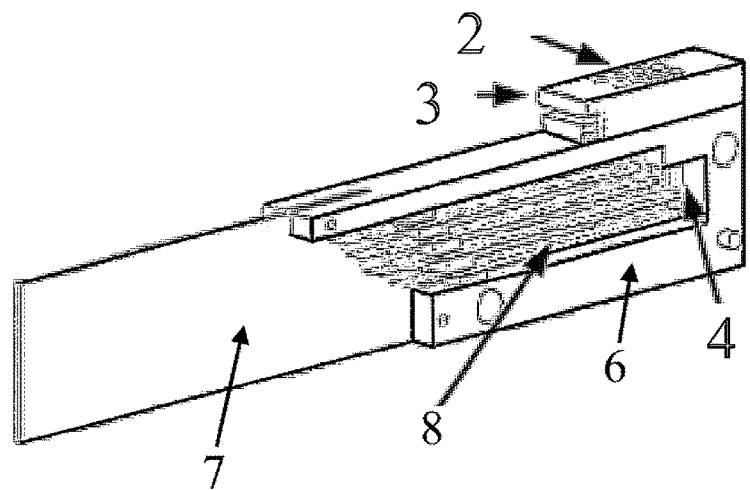
FIG. 1 is an illustration of a related art piezoelectric Braille cell.

Because this is a patent document, general broad rules of construction should be applied when reading it. Everything described and shown in this document is an example of subject matter falling within the scope of the claims, appended below. Any specific structural and functional details disclosed herein are merely for purposes of describing how to make and use examples. Several different embodiments and methods not specifically disclosed herein may fall within the claim scope; as such, the claims may be embodied in many alternate forms and should not be construed as limited to only examples set forth herein.

It will be understood that, although the terms first, second, etc. may be used herein to describe various elements, these elements should not be limited to any order by these terms. These terms are used only to distinguish one element from another; where there are "second" or higher ordinals, there merely must be that many number of elements, without necessarily any difference or other relationship. For example, a first element could be termed a second element, and, similarly, a second element could be termed a first element, without departing from the scope of example embodiments or methods. As used herein, the term "and/or" includes all combinations of one or more of the associated listed items. The use of "etc." is defined as "et cetera" and indicates the inclusion of all other elements belonging to the same group of the preceding items, in any "and/or" combination(s).

It will be understood that when an element is referred to as being "connected," "coupled," "mated," "attached," "fixed," etc. to another element, it can be directly connected to the other element, or intervening elements may be present. In contrast, when an element is referred to as being "directly connected," "directly coupled," etc. to another element, there are no intervening elements present. Other words used to describe the relationship between elements should be interpreted in a like fashion (e.g., "between" versus "directly between," "adjacent" versus "directly adjacent," etc.). Similarly, a term such as "communicatively connected" includes all variations of information exchange and routing between two electronic devices, including intermediary devices, networks, etc., connected wirelessly or not.

As used herein, the singular forms "a," "an," and "the" are intended to include both the singular and plural forms, unless the language explicitly indicates otherwise. It will be further understood that the terms "comprises," "comprising," "includes," and/or "including," when used herein, specify the presence of stated features, characteristics, steps, operations, elements, and/or components, but do not themselves preclude the presence or addition of one or more other features, characteristics, steps, operations, elements, components, and/or groups thereof.

The structures and operations discussed below may occur out of the order described and/or noted in the FIGS. For example, two operations and/or FIGS. shown in succession may in fact be executed concurrently or may sometimes be executed in the reverse order, depending upon the functionality/acts involved. Similarly, individual operations within example methods described below may be executed repetitively, individually or sequentially, to provide looping or other series of operations aside from single operations described below. It should be presumed that any embodiment or method having features and functionality described below, in any workable combination, falls within the scope of example embodiments.

The inventors have newly recognized one of the major reasons limiting access to Braille is the cost of electronic Braille displays. Electronic Braille displays are commonly known as "Refreshable Braille display" which have several pins moving up and down emulating the b Braille dots. Each piezoelectric actuated Braille dot costs around USD 4 and in a standard display of 40 cells, it sums up to USD 1,280 which is not affordable to majority of the blind and which is extremely high for the utility provided by such devices. This high cost limits its use in low-income settings where there is a relatively higher concentration of blind population, and there is a need to produce much less expensive electronic Braille displays. To overcome these newly-recognized problems as well as others and achieve these advantages, the inventors have developed example embodiments and methods described below to address these and other problems recognized by the Inventors with unique solutions enabled by example embodiments.

The present invention is Braille cell systems and methods of actuating the same. In contrast to the present invention, the few example embodiments and example methods discussed below illustrate just a subset of the variety of different configurations that can be used as and/or in connection with the present invention.

Figure 3A:
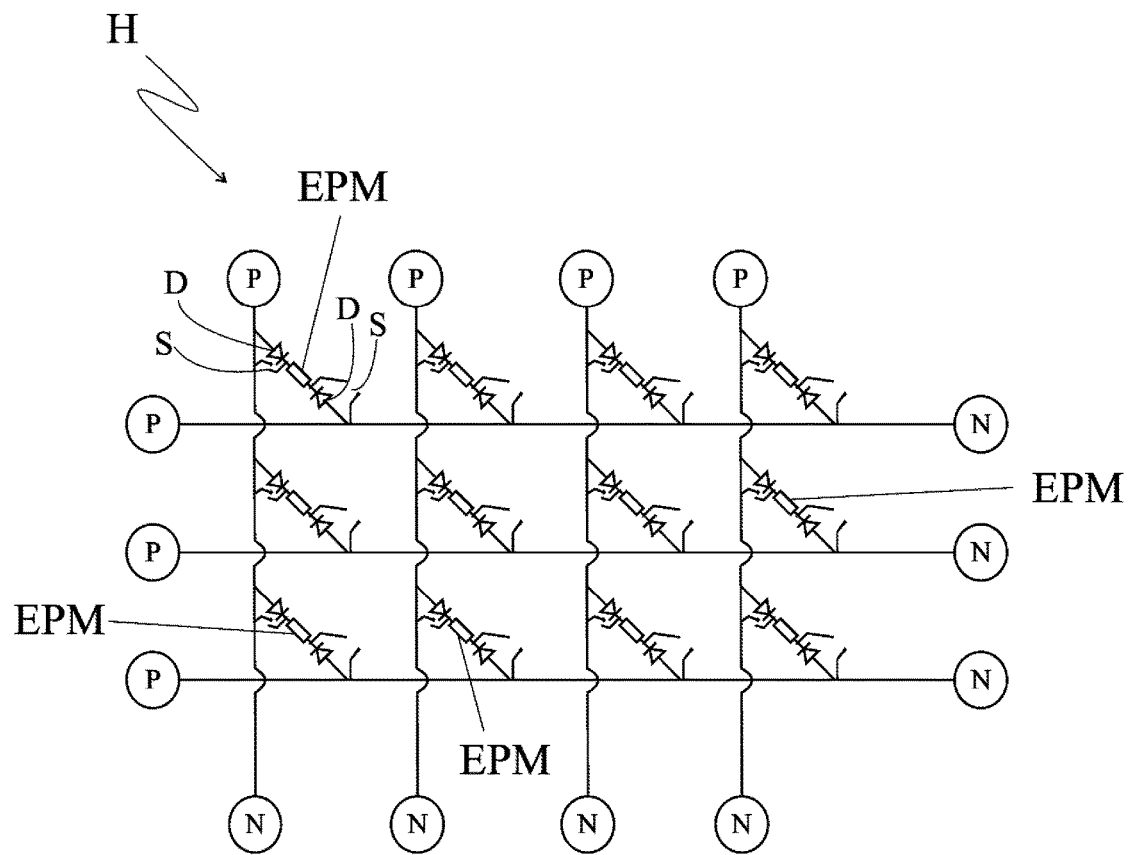
FIG. 3A illustrates a first example embodiment of a mesh framework.

In accordance with an example embodiment, there is provided a pre-defined mesh framework communicably coupled with magnets, such as, electro-permanent magnets—referenced by the numeral EPM. FIG. 3A illustrates the mesh framework according to a first example embodiment.

In at least one embodiment, electro-permanent magnets (EPMs) are used for actuation. They are a hybrid of electromagnets and permanent magnets. When coupled with a ferrous plate they form a linear actuator. This actuator is used to move the tactile pins operatively upward and operatively downward. When several of these tactile pins are stacked together, there is a need to provide efficient routing and driving circuit. To meet the stringent dimensional and performance norms of tactile displays, Electro-permanent magnets (EPMs) are used for actuation. The mesh framework is used to electrically actuate the electro-permanent magnets (EPMs) and create a 10-fold reduction in number of driving elements.

A mesh like structure is made with half H-bridges. To actuate the electro-permanent magnets (EPMs) at a pre-defined position in an array, the half H-bridges (illustrated by reference numeral H) of corresponding row and column is activated. Each row is flanked by a P-channel MOSFET on one side and an N-channel MOSFET on its other side. Similarly, each column is flanked by a P-channel MOSFET on one side and an N-channel MOSFET on its other side. Each junction of this array of rows and columns includes an electro-permanent magnet (EPM). Diodes (D) are provided on either side of the EPM, at each junction, in the array such that current flows in one pre-defined route/direction.

In at least one embodiment, between each diode (D) and an adjacently corresponding EPM, a switch (S) is provided. The reason for keeping the switch and the diodes is to remove the looping problem (surrounding EPMs are actuated while trying to actuate one particular EPM). When there is a need to pass a current in one particular EPM in one particular direction, the corresponding N-channel and P-channel MOSFETs are activated. To avoid the current from flowing in other EPMs, in at least one embodiment a diode and switch are kept. The switch is turned on in order to short the diode which blocks the current in the EPM of interest and hence allows current to flow in that particular EPM only in that particular direction.

E.g. in order to actuate an EPM in row 1 and column 1, the half H-bridges of row 1 and column 1 are activated and current will form one of the half H-bridges through the EPM (1,1) into the second Half H-bridge. By using such a structure, it is possible to reduce the number of H-bridges from the number of EPMs to a minimum of (sq. root of no. of EPMs)*2. This activation is done by means of the switches (S) and diodes (D).

Figure 3B:
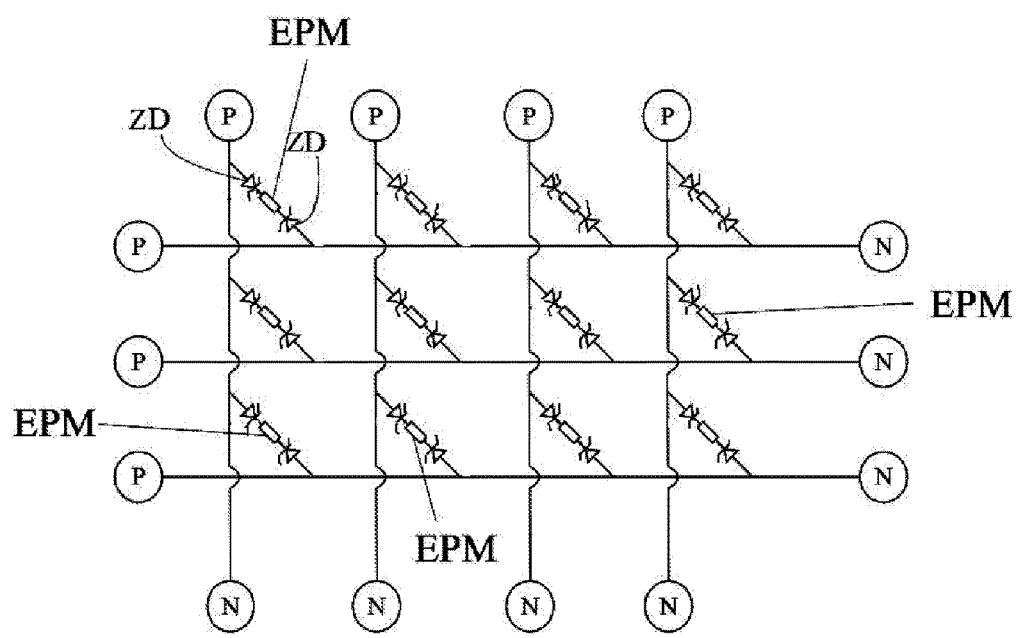
FIG. 3B illustrates a second example embodiment mesh framework.

FIG. 3B illustrates the mesh framework according to a second example embodiment. In at least an alternative embodiment, the diodes are Zener diodes (ZD) and no switch is provided. A Zener diode is a diode which allows current to flow in the forward direction in the same manner as an ideal diode, but also permits it to flow in the reverse direction when the voltage is above a certain value known as the breakdown voltage, "Zener knee voltage".

In at least the alternative diode, Zener diodes solve the looping problem. Zener diode as explained above has a threshold voltage (knee voltage) above which it allows current to pass when in reverse bias. There are 2 Zener diodes (ZD) around each EPM in opposite direction. So, whenever the MOSFETs are activated to flow current in one particular EPM in one direction, the Zener diodes produce a voltage drop. If V is applied across the MOSFETs, the Zener diode pairs are selected to produce V/3 voltage drop. So, the EPM corresponding to which the MOSFETs have been activated receives 2V/3 voltage. The other path (loop) requires the current to flow through at least 3 EPMs and 3 Zener diode pairs. Hence, if each Zener diode pair produces a voltage drop of V/3. The total drop by Zener diodes in the loop becomes V which is equal to the applied voltage at the MOSFETs. Hence there is no voltage left to actuate the EPMs in the loop. So, by this method, loops can be removed while removing the switches. This embodiment replaces a mechanical switch, thereby reducing cost, time lag, and risk of failure.

Figure 2:
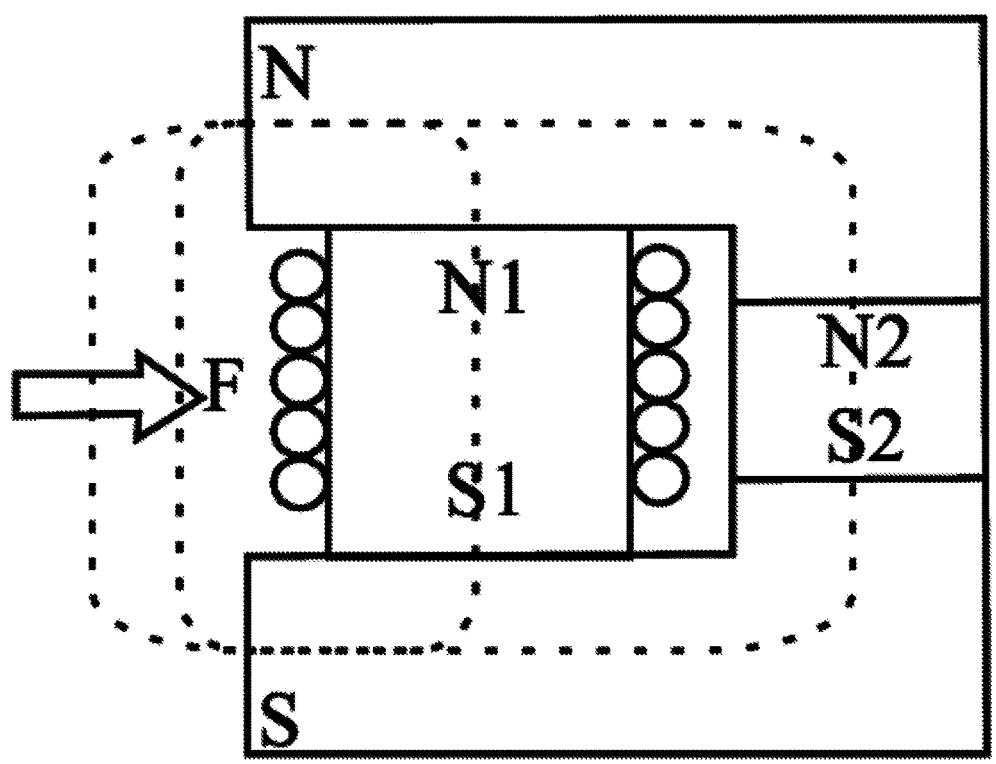
FIG. 2 illustrates a mechanical principle of operation of electro-permanent magnets (EPMs).

FIG. 2 relates to mechanical principle of operation of electro-permanent magnets (EPMs). An electro-permanent magnet (EPM) may include 2 magnets; a soft magnet, Alnico (referenced by N1S1) surrounded by a coil and a powerful hard magnet, Neodymium (referenced by N2S2). Both the magnets are sandwiched between ferrous metal plates. By switching the poles of the Alnico magnet through the coil, it is possible to alter the magnetic flux going out of the actuator (EPMs). When the Alnico and Neodymium are magnetized in the same direction, the flux of both the magnets flows through the metal plates and out of the EPM. By passing a short pulse in the coil, the Alnico magnet goes through a hysteresis loop and magnetizes in the opposite direction. Now, the flux of Neodymium flows into the Alnico and no flux leaks out of the EPM. Hence, by controlling the flux outside from 0% to 100%, it is possible to simulate a switch like behavior of magnetic attraction.

An H bridge is an electronic circuit that enables a voltage to be applied across a load in either direction.

Figure 4:
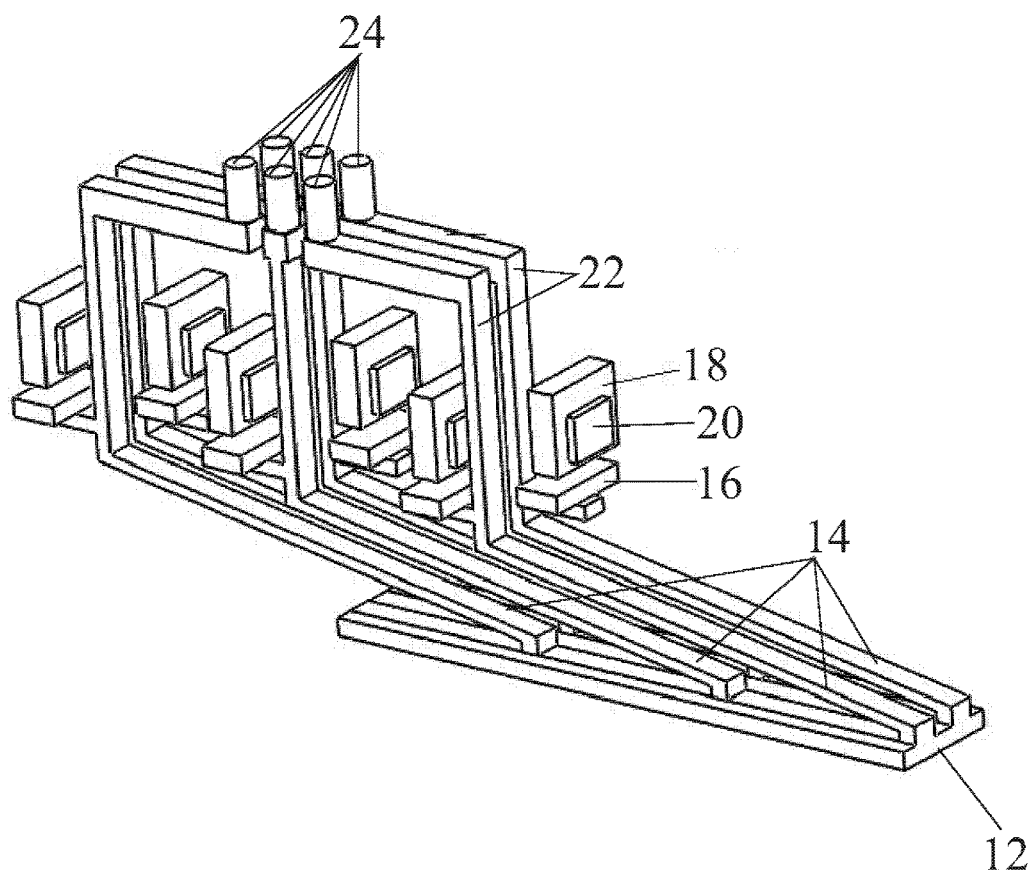
FIG. 4 is a perspective illustration an example embodiment Braille cell assembly for single-line Braille display.
Figure 5:
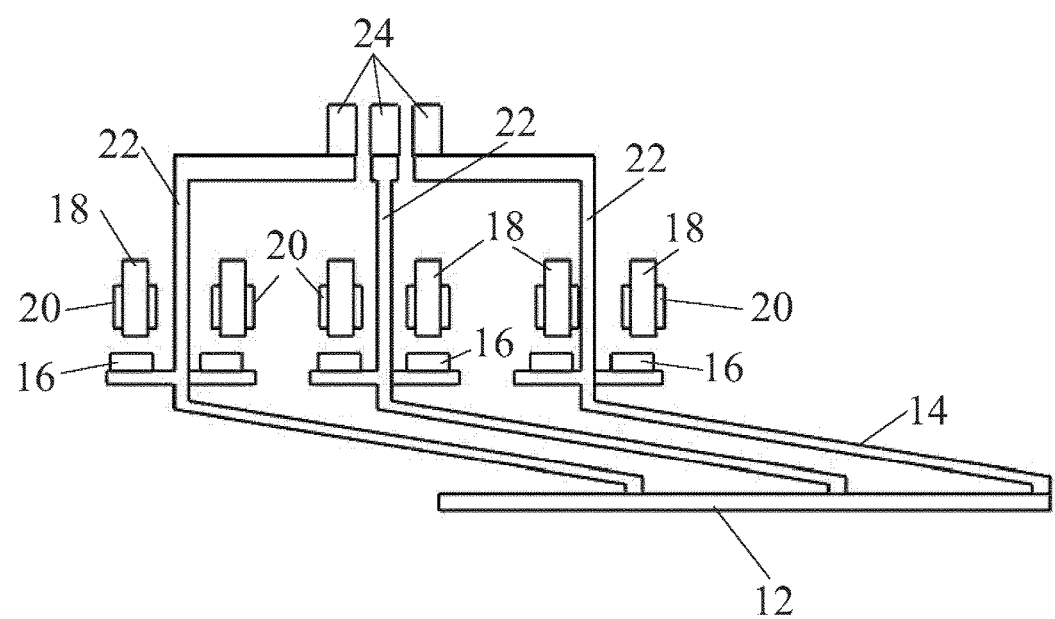
FIG. 5 is a profile schematic view of the example embodiment Braille cell assembly.

In accordance with another example embodiment, there is provided an angularly-displaceable actuator assembly with in order to provide actuation of a dot in a Braille cell as per requirement for use in a refreshable Braille reader display. FIG. 4 illustrates a first example embodiment of the angularly-displaceable actuator assembly.

In its first example embodiment, a first operatively horizontally disposed elongate rod (12a) is provided with an operative proximal end and an operative distal end. This first elongate rod (12a) is angularly-displaceable about a pivot hinge (13). This pivot hinge (13) is a flexible hinge. Further, a second operatively horizontally disposed elongate rod (12b) is provided with an operative proximal end and an operative distal end and is in co-axial with the first operatively horizontally disposed elongate rod (12b). This second elongate rod (12b) is also angularly-displaceable about a pivot hinge (13).

In at least a first example embodiment, at the operative distal end of the first operatively horizontally disposed elongate rod (12a), there is provided an electro-permanent magnet (16). This electro-permanent magnet is located in a cantilever manner and may be held by brackets (14). Further, in at least this first example embodiment, at least a tactile pin (11) is provided at the operative proximal end of the first operatively horizontally disposed elongate rod (12a). This pin (11) protrudes away from the direction of the electro-permanent magnet (16). The hinge has its one end configured to a base (15) and its other end configured to the first operatively horizontally disposed elongate rod (12a). In at least this first example embodiment, a metal plate (18) extends longitudinally to the base (15) and below the cantilever-positioned electro-permanent magnet such that as the electro-permanent magnet is magnetically actuated, it gets attracted to the metal plate (18) beneath it. The hinge (15) which is flexible in nature allows the electro-permanent magnet (16) to move towards the metal plate (18), thereby angularly displacing the tactile pin (11) in a direction away from the direction of electro-permanent magnet movement, thus allowing it to engage with a Braille dot located advantageously over it.

Similarly, in at least this first example embodiment, at the operative distal end of the second operatively horizontally disposed elongate rod (12b), there is provided an electro-permanent magnet (16). This electro-permanent magnet is located in a cantilever manner and may be held by brackets (14). Further, in at least this first example embodiment, at least a tactile pin (11) is provided at the operative proximal end of the second operatively horizontally disposed elongate rod (12b). This pin (11) protrudes away from the direction of the electro-permanent magnet (16). The hinge has its one end configured to a base (15) and its other end configured to the first operatively horizontally disposed elongate rod (12a). In at least this first example embodiment, a metal plate (18) extends longitudinally to the base (15) and below the cantilever-positioned electro-permanent magnet (16) such that as the electro-permanent magnet is magnetically actuated, it gets attracted to the metal plate (18) beneath it. The hinge (15) which is flexible in nature allows the electro-permanent magnet (16) to move towards the metal plate (18), thereby angularly displacing the tactile pin (11) in a direction away from the direction of electro-permanent magnet movement, thus allowing it to engage with a Braille dot located advantageously over it. This enables to spread out the EPMs and drastically reduce interference.

FIG. 4 illustrates an example embodiment of an angularly displaceable actuator assembly. As seen in FIG. 4, a first operatively horizontally disposed elongate rod (12) is provided as a base. In at least an embodiment, there are provided obliquely extending elongate shafts (14) extending from the base to support metal plates (16) with electro permanent magnets (18) at its operative distal end. These obliquely extending elongate shafts act as resilient elements and are angularly displaceable about their pivot point which is the obliquely extending elongate shaft's junction point with the base. These electro-permanent magnets may be held by brackets (20).

In at least an embodiment, the obliquely extending elongate shafts further extend in to an operative vertical shaft (22) comprising at least a tactile pin (24) at its operative top part. The tactile pin corresponds to a Braille pin. Each Braille pin is associated with at least one electro-permanent magnet, at least one metal plate, at least one operatively vertical shaft, at least one obliquely extending shaft and a common base plate.

As the electro-permanent magnet is magnetically actuated, it attracts the metal plate (16) beneath it. The corresponding obliquely extending elongate shaft is pulled as the metal plate gets pulled towards it. As the obliquely extending elongate shaft gets pulled operatively upward, the corresponding operative vertical shaft also moves operatively upward, thereby pushing the corresponding Braille pin operatively upwards, thus allowing it to engage with a Braille dot located over it.

When an electric pulse in a first direction is passed through the electro-permanent magnet (16), it leaks all its flux and is attracted towards the metal plate (18). This attraction translates into physical displacement of the electro-permanent magnet (16) and consequently of the tactile pin (11). To bring back the pin (11) to its initial state, another pulse in the opposite direction (to the first direction) is passed through the electro-permanent magnet, stopping the leakage of flux and eventually removing the attraction. The pin (11) falls back to its initial state due to gravity. This can be repeated millions of time. As the pin (11) moves up, it engages with a Braille dot and the Braille is embossed in accordance with the line that is to be converted to Braille language and that is to be read.

Example methods and embodiments thus being described, it will be appreciated by one skilled in the art that example embodiments may be varied through routine experimentation and without further inventive activity. For example, example embodiments have been described in large Braille cell displays, it is understood that vastly different sizes and types of displays may be used in the same. Variations are not to be regarded as departure from the spirit and scope of the exemplary embodiments, and all such modifications as would be obvious to one skilled in the art are intended to be included within the scope of the following claims.

What is claimed is:

1. An angularly-displaceable actuator configured to provide actuation of a Braille dot in a Braille cell in a refreshable Braille reader display, comprising:
    a horizontally-disposed elongate rod with a proximal end and a distal end;
    a first shaft joined to the horizontally-disposed elongate rod about a pivot point at an end of the first shaft so as to angularly move about the horizontally-disposed elongate rod;

a metal plate separated from an electro-permanent magnet, wherein the metal plate is supported by the first shaft; and a tactile pin joined to the first shaft and corresponding to the Braille dot, wherein the electro-permanent magnet corresponds to the tactile pin and is configured to, in response to a first electric pulse in a first direction passed through the electro-permanent magnet, be magnetically attracted to the metal plate so as to cause angular displacement of the first shaft and physical displacement of the tactile pin to engage with the Braille dot spaced apart from a head of the tactile pin head, and in response to a second electric pulse in a second direction opposite to the first direction passed through the electro-permanent magnet, stop being magnetically attracted to the fixed plate so as to cause the tactile pin to fall back and disengage from the Braille dot.

2. The Braille cell actuator of claim 1, wherein the electro-permanent magnet is held by a bracket.

3. The Braille cell actuator of claim 1, wherein the tactile pin is vertical.

4. The Braille cell actuator of claim 1, wherein the tactile pin is at a top portion of the first shaft.

5. The Braille cell actuator of claim 1, wherein the metal plate is spaced apart from the first shaft at a side of the first shaft.

6. The Braille cell actuator of claim 1, wherein the pivot point is a flexible hinge.

7. The Braille cell actuator of claim 1, wherein the tactile pin is a Braille pin head.

8. The Braille cell actuator of claim 1, wherein the pivot point is a resilient element.

9. The Braille cell actuator of claim 1, wherein the Braille dot forms a character in the Braille language.

10. The Braille cell actuator of claim 1, further comprising:

a pre-defined mesh framework communicably coupled with the electro-permanent magnet, wherein the mesh framework includes half H-bridges.

11. The Braille cell actuator of claim 1, further comprising:

a pre-defined mesh framework communicably coupled with the electro-permanent magnet, wherein the mesh framework includes an array of rows and columns with, each of the rows having a P-channel MOSFET on one end and an N-channel MOSFET on another end, each of the columns having a P-channel MOSFET on one end and an N-channel MOSFET on another end, and each junction of a row and a column includes an electro-permanent magnet having diodes on each side so that current flows in one direction, and wherein the diodes are activated by corresponding switches.

12. The Braille cell actuator of claim 11, wherein the diodes are zener diodes.

13. The Braille cell assembly of claim 1, further comprising:

a second shaft joined to the horizontally-disposed elongate rod about a second pivot point so as to angularly move about the horizontally-disposed elongate rod;

another metal plate having another electro-permanent magnet, wherein the another metal plate is supported by the second shaft, another tactile pin joined to the second shaft and corresponding to the Braille dot, wherein the another electro-permanent magnet corresponds to the another tactile pin.

* * * * *